US006541896B1

(12) United States Patent
Piel, Jr. et al.

(10) Patent No.: US 6,541,896 B1
(45) Date of Patent: Apr. 1, 2003

(54) METHOD FOR MANUFACTURING COMBINED ACOUSTIC BACKING AND INTERCONNECT MODULE FOR ULTRASONIC ARRAY

(75) Inventors: Joseph Edward Piel, Jr., Scotia, NY (US); Robert Stephen Lewandowski, Amsterdam, NY (US); Brady Andrew Jones, Sunset Beach, NC (US)

(73) Assignee: General Electric Company, Niskayuna, NY (US)

( * ) Notice: Subject to any disclaimer, the term of this patent is extended or adjusted under 35 U.S.C. 154(b) by 664 days.

(21) Appl. No.: 08/998,559

(22) Filed: Dec. 29, 1997

(51) Int. Cl.[7] ................................................ H01L 41/08
(52) U.S. Cl. ........................................ 310/334; 310/335
(58) Field of Search .................................. 310/334, 335

(56) References Cited

U.S. PATENT DOCUMENTS

| | | | | | |
|---|---|---|---|---|---|
| 4,404,489 | A | * | 9/1983 | Larson, III et al. | 310/334 |
| 4,701,659 | A | * | 10/1987 | Fujii et al. | 310/334 |
| 4,825,115 | A | * | 4/1989 | Kawabe et al. | 310/327 |
| 5,163,436 | A | * | 11/1992 | Saitoh et al. | 128/662.03 |
| 5,267,221 | A | | 11/1993 | Miller et al. | 367/140 |
| 5,296,777 | A | * | 3/1994 | Mine et al. | 310/334 |
| 5,329,498 | A | | 7/1994 | Greenstein | 367/155 |
| 5,427,106 | A | | 6/1995 | Breimesser et al. | 128/661.01 |
| 5,559,388 | A | * | 9/1996 | Lorraine et al. | 310/334 |

OTHER PUBLICATIONS

Smith et al., "Two–Dimensional Arrays for Medical Ultrasound", Ultrasonic Imaging, vol. 14, pp. 213–233 (1992).
Daane et al., "A Demountable 50 x50 Pad Grid Array Interconnect System", SPIE vol. 3037, pp. 124–128 (1997).
Greenstein et al., "A 2.5 MHz 2D Array with Z–Axis Backing", SPIE vol. 3037, pp. 48–54 (1997).

* cited by examiner

*Primary Examiner*—Mark O. Budd
(74) *Attorney, Agent, or Firm*—Patrick K. Patnode; Christian G. Cabou

(57) ABSTRACT

A combined acoustic backing and interconnect module for connecting an array of ultrasonic transducer elements to a multiplicity of conductors of a cable utilizes the backing layer volume to extend a high density of interconnections perpendicular to the transducer array surface. The module is made by injecting flowable backfill material into a mold made up of a plurality of spacer plates having aligned channels, with interleaved flexible circuit boards. The backfill material is cured to form a backing layer which supports the flexible circuit boards in mutually parallel relationship. Excess flexible circuit material on one side of the backing layer is cut flush with the front face of the backing layer, leaving exposed ends of the conductive traces on the flexible circuit boards. The module is then laminated to a piezoelectric ceramic layer, and diced. The flexible circuit board conductive traces are aligned with, and electrically connected to, signal electrodes of the transducer elements. The other ends of the conductive traces on a fanout portion of the flexible circuit board are connected to the cable.

7 Claims, 6 Drawing Sheets

METHOD FOR MANUFACTURING COMBINED ACOUSTIC BACKING AND INTERCONNECT MODULE FOR ULTRASONIC ARRAY

FIELD OF THE INVENTION

This invention generally relates to ultrasound probes having an array of piezoelectric transducer elements. In particular, the invention relates to systems for electrically connecting the transducer array of an ultrasound probe to a coaxial cable.

BACKGROUND OF THE INVENTION

A typical ultrasound probe consists of three basic parts: (1) a transducer package; (2) a multi-wire coaxial cable connecting the transducer to the rest of the ultrasound system; and (3) other miscellaneous mechanical hardware such as the probe housing, thermal/acoustic potting material and electrical shielding. The transducer package (sometimes referred to as a "pallet") is typically produced by stacking layers in sequence. This involves a high density of interconnections and, as the density of interconnections to ultrasonic transducer arrays increases, so does the complexity of these connections. The standard methods of interconnect on multi-row transducer arrays, such as flex boards extending in a plane parallel to the surface of the transducer, are geometrically constrained and also tend to interfere with the acoustics and dicing of the transducer.

The present invention concerns an acoustic backing and interconnect module and a method of using the volume of the acoustic backing layer to make the interconnections to an ultrasonic array reliably and efficiently.

SUMMARY OF THE INVENTION

A combined acoustic backing and interconnect module for connecting an array of ultrasonic transducer elements to a multiplicity of conductors of a cable utilizes the volume of the backing layer to extend a high density of interconnections perpendicular to the surface of the transducer array. The invention further comprises a method for manufacturing such an acoustic backing and interconnect module by injection molding.

The invention is particularly advantageous when used to construct multi-row transducer arrays, such as 1.25D (elevation aperture is variable, but focusing remains static), 1.5D (elevation aperture, shading, and focusing are dynamically variable, but symmetric about the horizontal centerline of the array) and 2D (elevation geometry and performance are comparable to azimuth, with full electronic apodization, focusing and steering arrays). However, the invention can also be used to manufacture single-row transducer arrays.

In accordance with the invention, an ultrasonic transducer array made up of piezoelectric ceramic elements is provided with a high-density interconnection to the piezoelectric ceramic elements which extends through the acoustic backing layer. In accordance with a preferred method of manufacture, a mold for an acoustic backing and interconnect module is assembled by alternately stacking spacer plates and flexible circuit boards. Each spacer plate has a spacer channel defined in part by a first planar wall. The spacer channels are aligned when the mold is assembled so that the first planar walls are coplanar. Each flexible circuit board has an opening which aligns with one end of the spacer channels. The acoustic backfill material is injected into the mold, filling each channel. After the backfill material has cured to form the backing layer, the flexible, circuit boards are held in spaced parallel relationship. The excess flexible circuit material on the side of the backing layer formed by the coplanar first planar walls is then cut away to expose the ends of the conductors on the flexible circuit boards. When the backing layer is bonded to the piezoelectric ceramic layer, the exposed ends of the conductors are aligned with, and brought into electrical contact with, respective signal electrodes of the transducer array, thereby making the electrical connections between the array elements and the conductive traces on the flexible circuit boards en masse.

Optionally, in accordance with another feature of the invention, contact bumps or pads made of electrically conductive material (e.g., gold) can be plated over the exposed ends of the flexible circuit board conductors to ensure good electrical contact with the signal electrodes.

DETAILED DESCRIPTION OF THE PREFERRED EMBODIMENTS

Figure 1:
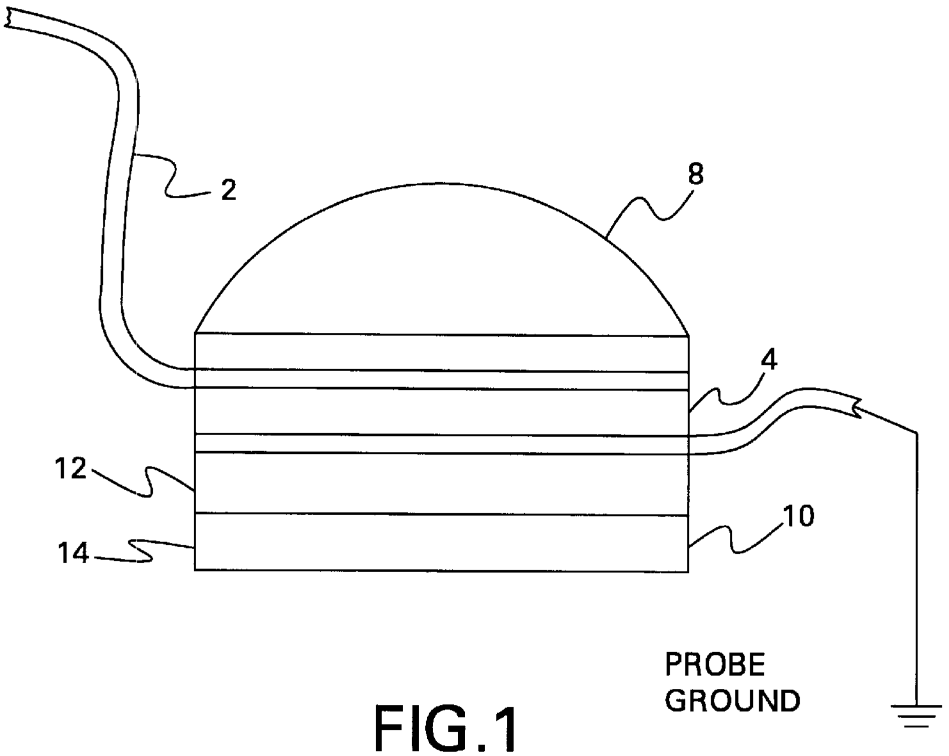
FIG.1 (PRIOR ART)
FIG. 1 is a schematic end view of a conventional ultrasonic transducer array having a flexible printed circuit board connected to the signal electrodes of the transducer elements.

FIG. 1 shows a flexible printed circuit board 2 bonded to a metal-coated rear face of a large piezoelectric ceramic block 4. A conductive foil 10 is bonded to a metal-coated front face of the piezoelectric ceramic block to provide a ground path for ground electrodes of the final transducer array. A first acoustic impedance matching layer 12 is bonded to conductive foil 10. Optionally, a second acoustic impedance matching layer 14 having an acoustic impedance less than that of matching layer 12 is bonded to the front face of matching layer 14.

The transducer array of FIG. 1 also comprises a backing layer 8 made of suitable acoustic damping material having high acoustic losses. This backing layer is acoustically coupled to the rear surface of piezoelectric ceramic material 4 through circuit board 2 to absorb ultrasonic waves that emerge from the back side of material 4.

Figure 2:
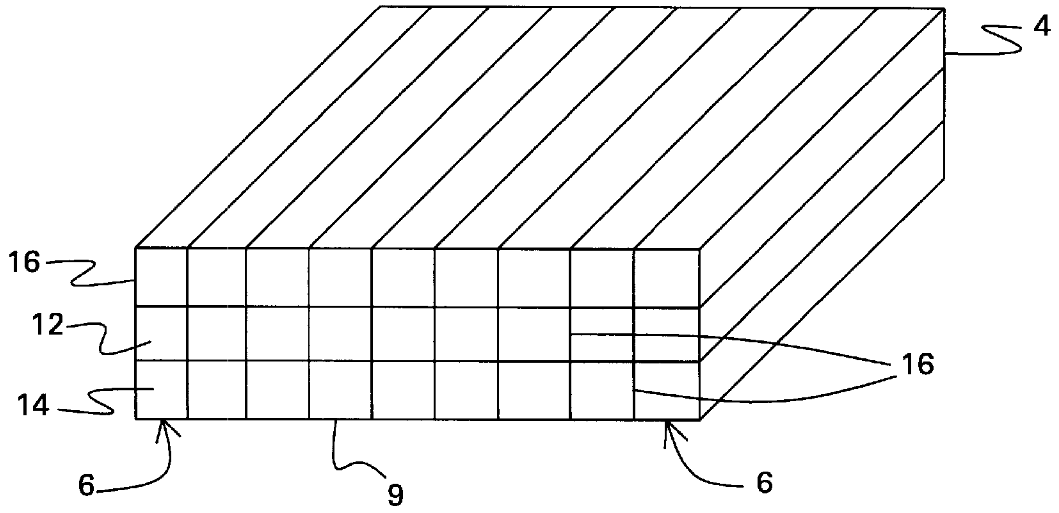
FIG.2 (PRIOR ART)
FIG. 2 is a schematic isometric view of a typical transducer array after dicing.

As shown in FIG. 2, the stack of layers comprising the transducer array of FIG. 1 is then "diced" by sawing vertical cuts, i.e., kerfs, from the front face 9 of the stack to a depth sufficient to divide the laminated assembly into a multiplicity of separate side-by-side transducer elements 6, each element comprising a stack of respective portions of layers 4, 12 and 14. The kerfs 16 produced by this dicing operation are indicated by parallel lines in FIG. 2, each line representing a gap of predetermined width separating adjacent array elements. During dicing, the bus of transducer flexible circuit board 2 (shown in FIG. 1) is cut to form separate terminals and the metal-coated rear and front faces of piezoelectric ceramic block 4 are cut to form separate signal and ground electrodes, respectively.

Figure 3:
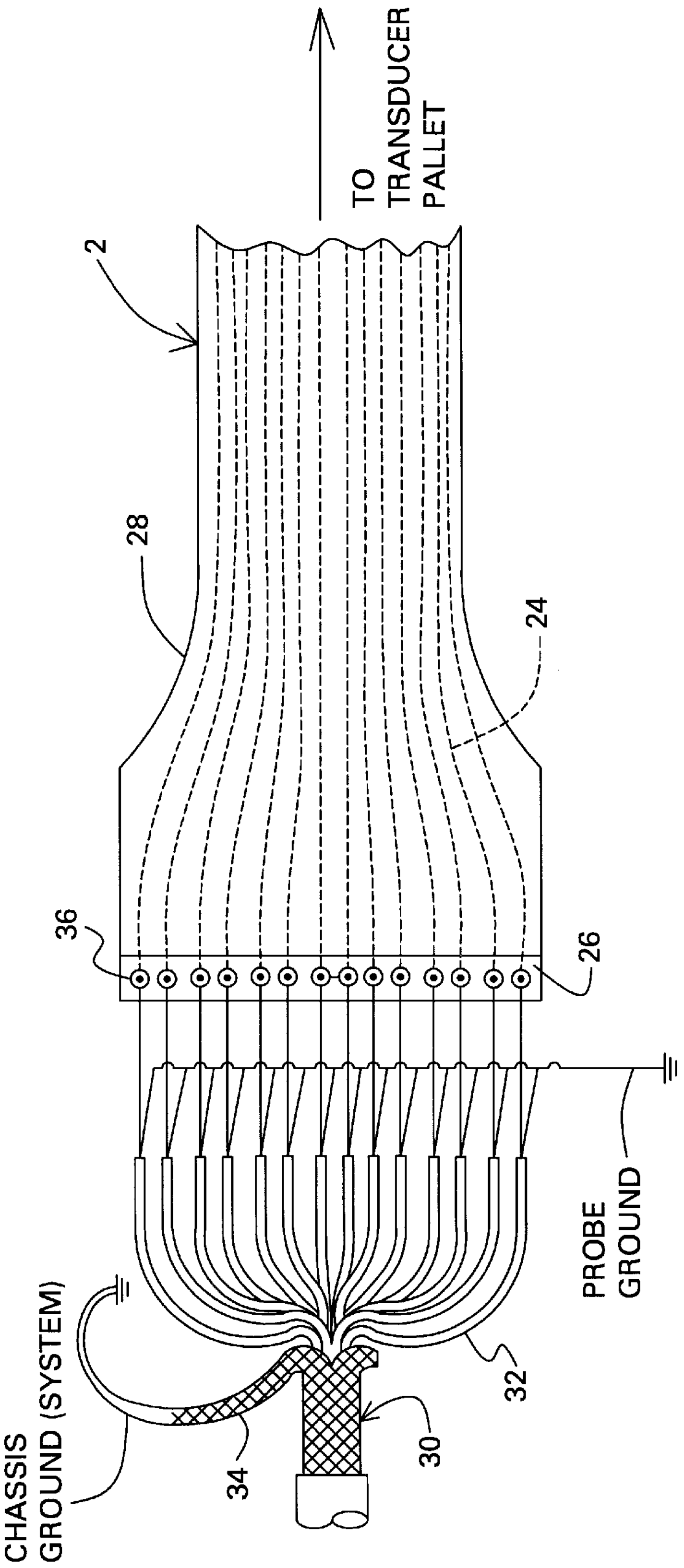
FIG.3 (PRIOR ART)
FIG. 3 is a schematic plan view showing the connection of a fanout flexible circuit board to a multi-wire coaxial cable.

A known technique for electrically connecting the piezoelectric elements of a single row of transducer elements to a multi-wire coaxial cable is by a transducer flexible circuit board in which the conductive traces fan out, that is, a flexible circuit board having a plurality of etched conductive traces extending from a first terminal area which connects to the coaxial cables, to a second terminal area which connects to the transducer elements. The terminals in the first terminal area have a linear pitch greater than the linear pitch of the terminals in the second terminal area. A typical fanout flexible circuit board is shown in FIG. 3, One terminal area of flexible circuit board 2 is electrically connected to the signal electrodes (not shown) of the piezoelectric transducer array, while the other terminal area of flexible circuit board 2 is electrically connected to the wires 32 of a multi-wire coaxial cable 30. Each wire 32 is a coaxial cable with a center conductor and an exterior ground braid (not shown). The ground braids are connected to a common probe ground. Coaxial cable 30 has a braided sheath 34 connected to the common ground of the ultrasound system (i.e., chassis ground). Flexible circuit board 2 has a multiplicity of conductive traces 24 etched on a substrate 26 of electrically insulating material. A cover layer 28 of electrically insulating material is formed on top of the etched substrate, with the exception of the terminal areas. The number of conductive traces 24 on flexible circuit board 2 is equal to the number of transducer array elements 6 (FIG. 2). Each conductive trace 24 has a terminal at one end, which is electrically connected in conventional manner to the signal electrode of a respective piezoelectric transducer element, and a pad 36 at the other end, which is electrically connected to a respective wire 32 of multi-wire coaxial cable 30. The linear pitch of pads 36 is greater than the linear pitch of the terminals on the opposite end of fanout flexible circuit board 2. Since circuit board 2 is flexible, the wiring assembly can be folded to occupy a minimal cross section. Of course, as the density of interconnections to the ultrasonic array increases, the complexity of these connections also increases. This method of interconnection also tends to interfere with the acoustics and dicing of the transducers, and is geometrically constrained.

Figure 4A:
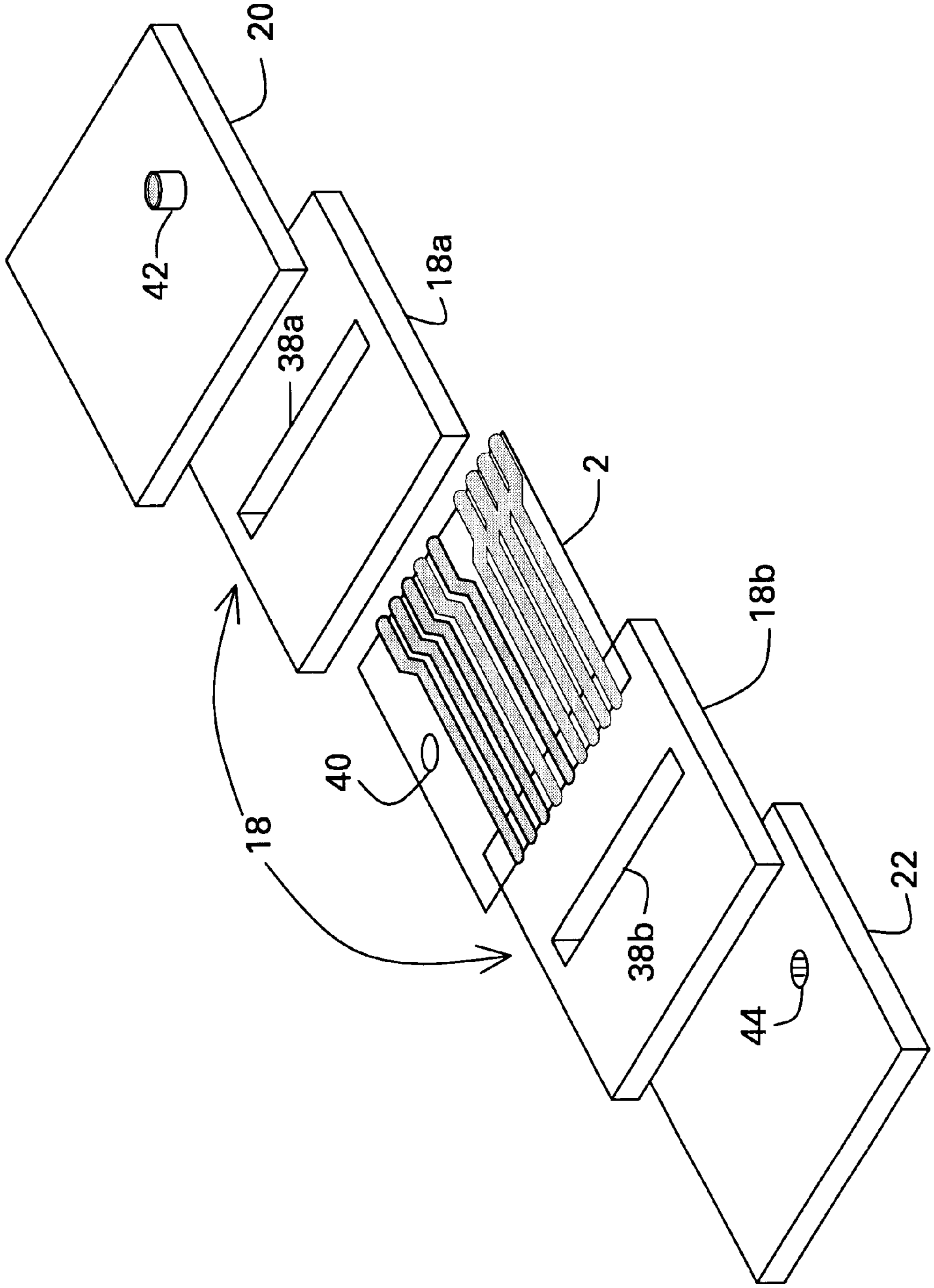
FIG. 4A is a schematic exploded isometric view of a mold and flexible circuit board in accordance with one preferred embodiment of the invention.
Figure 4B:
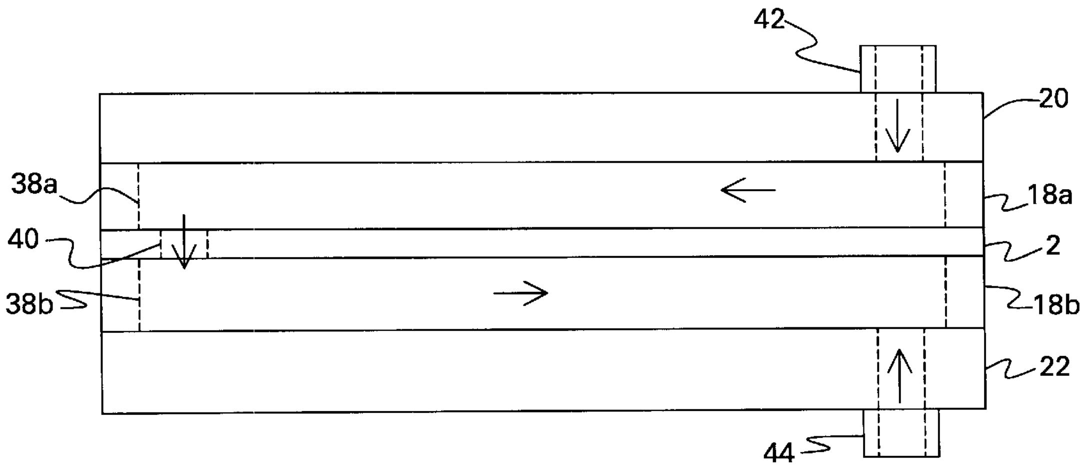
FIG. 4B is a schematic side view of the mold and flexible circuit board of FIG. 4A in an assembled state.

As shown in FIGS. 4A and 4B, an ultrasonic transducer array in accordance with a preferred embodiment of the invention is manufactured by placing one or more flexible printed circuit boards 2 in an injection mold and then injecting flowable acoustic backfill material into the mold. The mold comprises two or more spacer plates 18*a*, 18*b*, an inlet plate 20 and an outlet plate 22. The plates are stacked together with the spacer plates sandwiched between the inlet and outlet plates. Each spacer plate 18*a*, 18*b* has the same shape and dimensions, and includes a spacer channel 38*a*, 38*b*, respectively, in the form of a rectangular hole. Channels 38*a*, 38*b* are of the same size and shape and are located in the same position on each spacer plate 18*a*, 18*b*, respectively. In particular, each channel has a planar wall (not visible in FIG. 4A), and the planar walls are co-planar when the spacer plates are stacked together in alignment. The coplanar walls eventually shape the injection-molded material to form a planar front face of the acoustic backing layer.

Each flexible circuit board 2 has an opening 40 which aligns with one end of the spacer channels when the spacer plates and flexible circuit board have been stacked in alignment. Opening 40 allows backfill material to flow from the channel on one side of the flexible circuit into the channel on the other side. The position of the opening on successive flexible circuit boards alternates from one end of the channel to the other for each spacer plate/flexible circuit board layer in the stack.

To manufacture an array having n rows of elements, the appropriate number, n, of flexible circuit boards are sandwiched between (n+1) spacer plates. This stack is in turn sandwiched between inlet plate 20 and outlet plate 22. Plate 20 has an inlet port 42 located such that flowable backfill material can be injected into one end of channel 38*a* of the first spacer plate 18*a*. When injected, the acoustic backfill material flows down channel 38*a* to the other end thereof, filling the space between flexible circuit board 2 and inlet plate 20. The other end of channel 38*a* is in flow communication with channel 38*b* in the second spacer plate 18*b* via opening 40 in flexible circuit board 2. The backfill material is continuously injected until channel 38*b* is filled. Any excess backfill material flows out of a discharge port 44 in outlet plate 22.

Figure 4C:
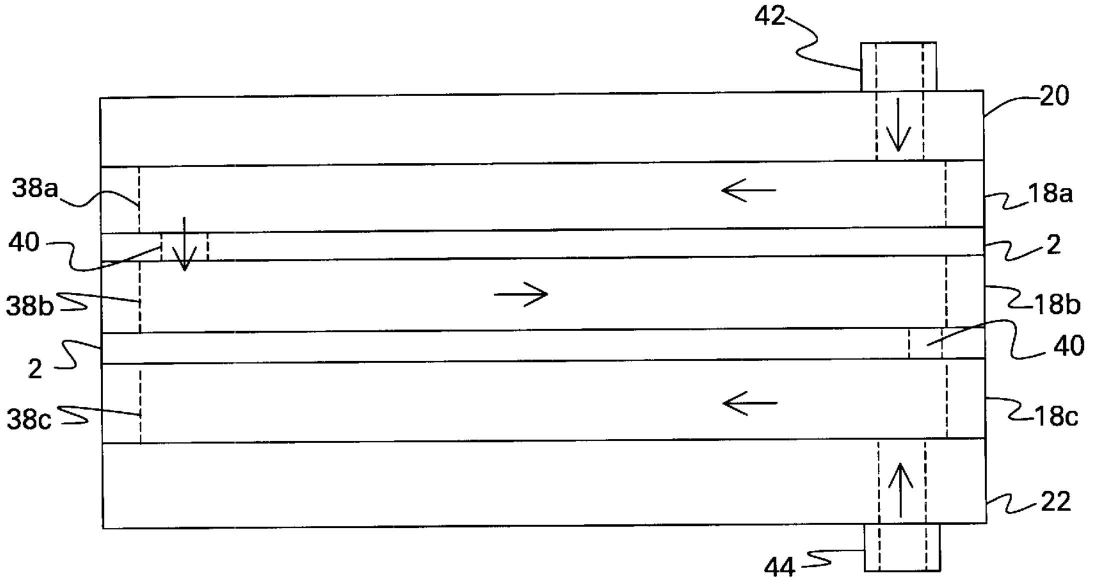
FIG. 4C is a schematic side view of a mold and two flexible circuit boards in an assembled state.

The mold assembly shown in FIG. 4A is designed for use in the manufacture of a single-row transducer element array; however, the technique of the invention can be extended to manufacture an array having two or more rows. For each additional row, another spacer plate and flexible circuit board are added to the mold assembly stack. Thus, FIG. 4C, which is a view similar to that of FIG. 4B, shows two flexible circuit boards 2 and 2' in a mold assembly between spacer plates 18*a* and 18*b*, and 18*b* and 18*c*, respectively. Each flexible circuit board has an opening 40 and 40', respectively, in fluid communication with the spacer channel on both sides, 38*a* and 38*b*, and 38*b* and 38*c*, respectively. Preferably, the openings 40, 40' in successive flexible circuit boards alternate in location from one end of the spacer channels to the other end, as shown, so as to cause the injected backfill material to flow in serpentine fashion from the inlet port to the outlet port, thus filling all voids between the flexible circuit boards.

Figure 6B:
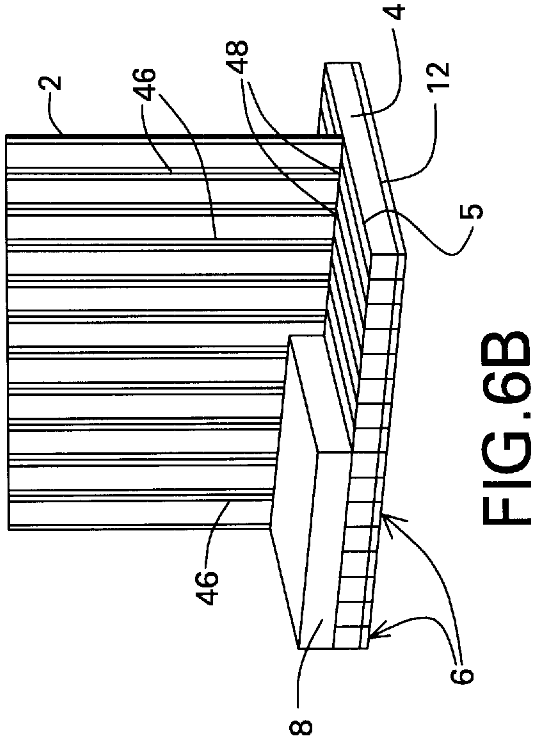
FIG. 6B is a schematic isometric view of a single row of ultrasonic transducer elements manufactured using the method of the present invention, with a portion of the backing layer partially cut away to expose the contact bumps which electrically connect the flex circuit to the transducer elements.
Figure 6A:
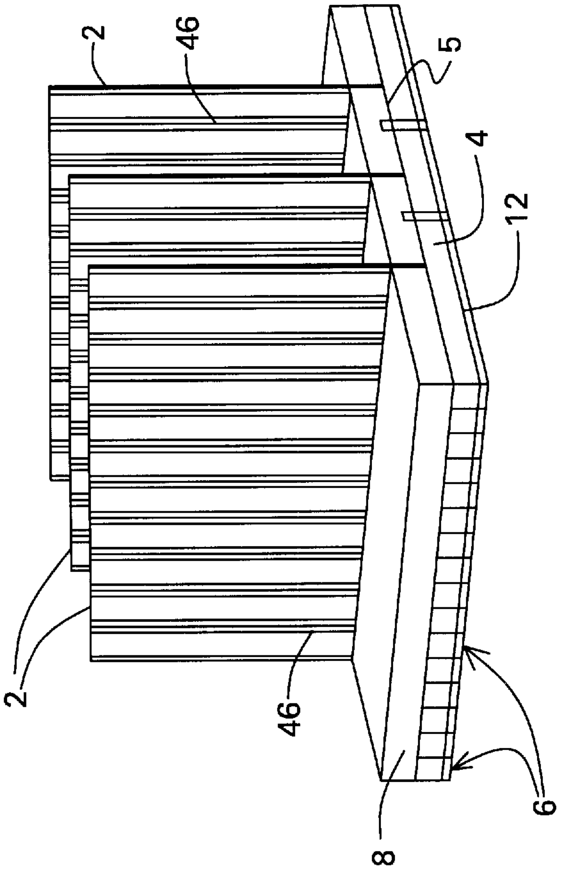
FIG. 6A is a schematic isometric view of a multi-row transducer pallet manufactured using the method of the present invention.

The backfill material in the mold is cured to form a layer 8 of solid acoustic damping material, shown in FIGS. 6A and 6B, which supports the flexible circuit boards in a generally parallel array extending generally perpendicular to a front face of the layer of acoustic damping material. Excess flexible circuit material on one side of the backing layer (i.e., the portion opposite to the fanout portion) is then cut away to expose the ends of conductors 46 on the flexible circuit boards. The front face of the backing layer can be prepared for connection to the piezoelectric ceramic layer by completely covering the surface with metal. The acoustic backing and interconnect module are then ready to be combined with a laminated stack comprising a piezoelectric ceramic layer 4, a conductive foil 5, and at least one acoustic matching layer 12, as shown in FIG. 6A. In particular, the metallized front face of backing layer 8 is bonded to the metallized rear face of piezoelectric ceramic layer 4 using a thin layer of acoustically transparent adhesive. During the bonding step, the exposed ends of conductors 46 of the flexible circuit boards are brought into electrical contact with the metallized rear surface of piezoelectric ceramic layer 4. The metallized surfaces are sufficiently rough that electrical contacts are made through the adhesive, which is displaced into the interstices between contacting protrusions. The bonded layers are then diced, as previously described, to isolate the metallization into separate electrodes.

In accordance with a preferred embodiment of the invention, the ends of the conductive traces on the flexible circuit board are electrically connected to the metallization (e.g., gold) on the back surface of the piezoelectric ceramic layer by contact bumps or pads 48 (shown in FIG. 6B) made of gold, which can be plated on the exposed ends of the flexible circuit board conductors 46. The gold contact pads are then pressed against the gold metallization layer to form a gold-on-gold cold weld which will electrically connect each conductive trace to each corresponding electrode formed by metallization and dicing.

After the backing layer and interconnect module have been bonded to the transducer stack, the resulting pallet is diced to form transducer elements 6. In the case of a single-row array, the pallet is diced in the elevation direction to form a multiplicity of parallel kerfs which extend from the front face of the outermost acoustic matching layer to a depth such that the layer of metallization on the front face of the backing layer is cut, thereby forming a multiplicity of signal electrodes which are electrically connected in parallel to a corresponding multiplicity of conductive traces on the flexible circuit board.

In the case of a multi-row array, the pallet is diced in both the elevation and lateral directions to a depth greater than the depth of the interface of the backing and piezoceramic layers. However, in accordance with another preferred embodiment of the invention, a multi-row array can be fabricated by manufacturing a plurality of single-row arrays and then bonding the single-row arrays in side-by-side relationship. Each flexible circuit board is used to connect the transducer array to a coaxial cable, either directly or via an intermediate flexible circuit board.

Figure 5:
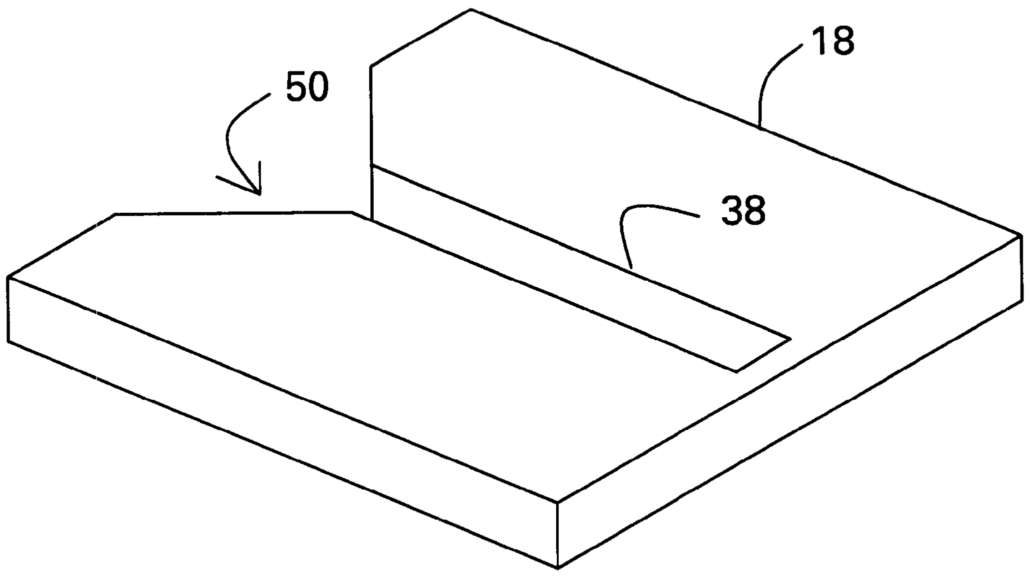
FIG. 5 is a schematic isometric view of a mold spacer in accordance with another preferred embodiment of the invention.

An alternative method of producing an acoustic backing and interconnect module in accordance with the invention requires modification of spacer 18', shown in FIG. 5, such that the backfill material is injected from the side of the mold into a funnel-shaped port 50 in spacer 18'. The spacers and flexible circuit boards are assembled as in the previously described method, except that the backfill is injected into the funnel side of the mold. The backfill fills all the voids between the flexible circuit boards and is then allowed to cure. The process continues as described previously.

The method of filling the mold through the funnel-shaped port can be modified by first filling the voids between the flexible circuit boards with cured and ground particles of an acoustic damping and scattering material, which particles would otherwise normally be held in suspension in the backfill epoxy. The backfill epoxy is then introduced into the mold while the mold is maintained in a vacuum. This disperses the epoxy through the mold, filling voids in the damping/scattering material. The process then continues as described previously.

While only certain preferred features of the invention have been illustrated and described, many modifications and changes will occur to those skilled in the art. For example, one or more acoustic matching layers can be employed. In addition, the mold can be constructed so that the first spacer plate is integrally formed with the inlet plate, while the last spacer plate is integrally formed with the outlet plate. It is, therefore, to be understood that the appended claims are intended to cover all such modifications and changes as fall within the true spirit of the invention.

What is claimed is:

1. A combined acoustic backing and interconnect module comprising: a first flexible planar circuit board having a first multiplicity of conductive traces, and support means attached to opposing sides of a section of said first flexible circuit board and having a planar surface extending generally perpendicular to said section of said first flexible planar circuit board, an end of each of said first multiplicity of conductive traces being exposed at said planar surface of said support means, said support means being made of acoustic damping material.

2. The combined acoustic backing and interconnect module as defined in claim wherein 1, said support means further includes an underlying piezoelectric ceramic layer extending beneath said section of said first flexible planar circuit board, said piezoelectric ceramic layer having a layer of metallization thereon.

3. The combined acoustic backing and interconnect module as defined in claim 1, further comprising an electrically conductive contact pad on respective ones of said conductive traces, said contact pads also being in electrical contact with the layer of metallization on said piezoelectric ceramic layer.

4. The combined acoustic backing and interconnect module as defined in claim 1, further comprising a second flexible planar circuit board having a second multiplicity of conductive traces and, said support means being attached to opposing sides of a section of said second flexible planar circuit board, an end of each of said second multiplicity of conductive traces being exposed at said planar surface of said support means.

5. An ultrasonic transducer pallet comprising:

a first row of ultrasonic transducer elements, each of said elements comprising an electrode and a piezoelectric ceramic layer coupled together;

an acoustic backing layer made of acoustic damping material laminated to said first row of ultrasonic transducer elements; and a first flexible planar circuit board having a first multiplicity of conductive traces, said first flexible planar circuit board penetrating said acoustic backing layer, and an end of each of said first multiplicity of conductive traces being electrically connected to the electrode of a respective one of said ultrasonic transducer elements of said first row.

6. The ultrasonic transducer pallet as defined in claim 5, further comprising a multiplicity of electrical conductive contact pads, said conductive traces of said first flexible planar circuit board being electrically connected to the electrodes of said first row of ultrasonic transducer elements, respectively, by said multiplicity of contact pads, respectively.

7. The ultrasonic transducer pallet as defined in claim 5, further comprising:

a second row of ultrasonic transducer elements arrayed in parallel with said first row of ultrasonic transducer elements and laminated to said acoustic backing layer, each of said ultrasonic transducer elements of said second row comprising an electrode, and a piezoelectric ceramic layer coupled together; and a second flexible planar circuit board having a second multiplicity of conductive traces, said second flexible planar circuit board penetrating said acoustic backing layer, and an end of each of said second multiplicity of conductive traces being electrically connected to the electrode of a respective one of said ultrasonic transducer elements of said second row.

* * * * *